United States Patent
Kaminski et al.

(10) Patent No.: US 6,285,046 B1
(45) Date of Patent: Sep. 4, 2001

(54) CONTROLLABLE SEMICONDUCTOR STRUCTURE WITH IMPROVED SWITCHING PROPERTIES

(75) Inventors: Nando Kaminski, Dietikon (CH); Horst Neubrand, Frankfurt (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/297,304

(22) PCT Filed: Sep. 17, 1997

(86) PCT No.: PCT/EP97/05080
§ 371 Date: Oct. 4, 1999
§ 102(e) Date: Oct. 4, 1999

(87) PCT Pub. No.: WO98/19342
PCT Pub. Date: May 7, 1998

(30) Foreign Application Priority Data

Oct. 29, 1996 (DE) .............................. 196 44 821

(51) Int. Cl.⁷ ...................... H01L 29/80; H01L 31/0312; H01L 31/112
(52) U.S. Cl. ............................ 257/263; 257/77; 257/256; 257/268; 257/279; 257/280
(58) Field of Search ..................................... 257/328, 256, 257/268, 269, 279, 280, 263, 264, 77

(56) References Cited

FOREIGN PATENT DOCUMENTS 59-65486 * 4/1984 (JP) ..................................... 257/263

* cited by examiner

*Primary Examiner*—Steven Loke
(74) *Attorney, Agent, or Firm*—Venable; Norman N. Kunitz

(57) ABSTRACT

The invention concerns a controllable semiconductor structure comprising a base region (101, 201, 301, 401), a source region (106, 212, 312, 412) and a drain region (107, 213, 313, 413) a conductive duct being provided in the base region between the source and drain. According to the invention, the duct can be constricted by regions lying parallel thereto, an active control region (102, 202, 302, 402) and an opposite passive control region (103, 203, 303, 403) which each form a blockable passage with the base region (101, 201, 301, 401). Further provided is a conductive connection (108, 209, 309, 409) between the passive control region (103, 203, 303, 403) and the source region (106, 212, 312, 412), the semiconductor material of the base region (101, 201, 301, 401) having an energy gap of more than 1.2 eV.

10 Claims, 3 Drawing Sheets

CONTROLLABLE SEMICONDUCTOR STRUCTURE WITH IMPROVED SWITCHING PROPERTIES

This is a 371 of PCT/EP97/05080, filed Sep. 17, 1997.

BACKGROUND OF THE INVENTION

The invention relates to a controllable semiconductor structure having improved switching properties.

The literature describes numerous component structures referred to as JFET or MESFET, in which the conduction properties are controlled by the voltage-dependent expansion of one or more space-charge zones (pn transition in JFET, Schottky transition in MESFET). The base structure was first proposed by W. Schockley: A Unipolar 'Field-Effect' Transistor, in the Proceedings of the I.R.E., 1952. In standard-technology conversions, as are described in W. von Münch, Einfuhrung in die Halbleitertechnologie [Introduction to Semiconductor Technology], Teubner, 1993, large parasitic capacitances (especially input capacitance and reverse-transfer or Miller capacitance) occur, leading to low limit frequencies in amplifiers and causing long switching times, and therefore large switching losses, in switching applications. This is also the case for high-blocking JFETs that operate according to the RESURF principle, for example, as described in U.S. Pat. No. 4,422,089; in these JFETs, the field-intensity peaks at the component surface are reduced by a suitable selection of the doping and depth of the lateral drift zone.

It is known from textbooks, e.g., R. Paul: Elektronische Halbleiterbauelemente [Electronic Semiconductor Components] that JFETs and MESFETs are usually produced on, for example, insulating, semiinsulating or insulated substrates (e.g., the SOI technique or sapphire in silicon, highly-compensated material in gallium arsenide, etc.) to minimize the parasitic capacitances.

These techniques have the following disadvantages:

1) Because of the insulating, semi-insulating or insulated substrate, no current flow can occur in the vertical direction. Therefore, no vertical components can be produced with this method, which limits its use for power components.

2) The production of wafers with an insulating or insulated substrate is complicated and expensive. In addition, problems due to, for example, temperature limitations can occur in the further processing.

3) In semiconductors that cannot be rendered semi-insulating through compensation, a second material must be used as an insulator. This leads to, on the one hand, stress because of different thermal expansion coefficients and, on the other hand, more intense internal heating of the components because of the generally lower thermal conductivity of the insulator. Furthermore, the crystal quality of the active semiconductor layer is frequently worse in heteroepitaxial production on an insulator than in homoepitaxially-produced layers because of erroneous lattice adaptation.

4) The insulation technique can only be combined with the RESURF technique in thin insulator layers, which in turn increases the parasitic capacitances.

It is therefore the object of the invention to use simple technological measures and few steps to create a semiconductor structure that has a good blocking effect, and permits higher limit frequencies and lower switching losses than conventional components.

SUMMARY OF THE INVENTION

The above object generally is achieved according to the present invention by a controllable semiconductor structure having a base region, a source region and a drain region, with a conductive channel being provided in the base region between the source and the drain, and wherein the channel can be pinched off by zones parallel thereto, including an active control zone and an oppositely-located passive control zone, which respectively form a blockable transition to the base region; a conductive connection is provided between the passive control zone and the source region; and the semiconductor material of the base region has a band gap of more than 1.2 eV.

The drawing illustrates embodiments of the invention.

A BRIEF DESCRIPTION OF THE DRAWINGS

DETAILED DESCRIPTION OF THE PREFERRED EMBODIMENTS

Figure 1:
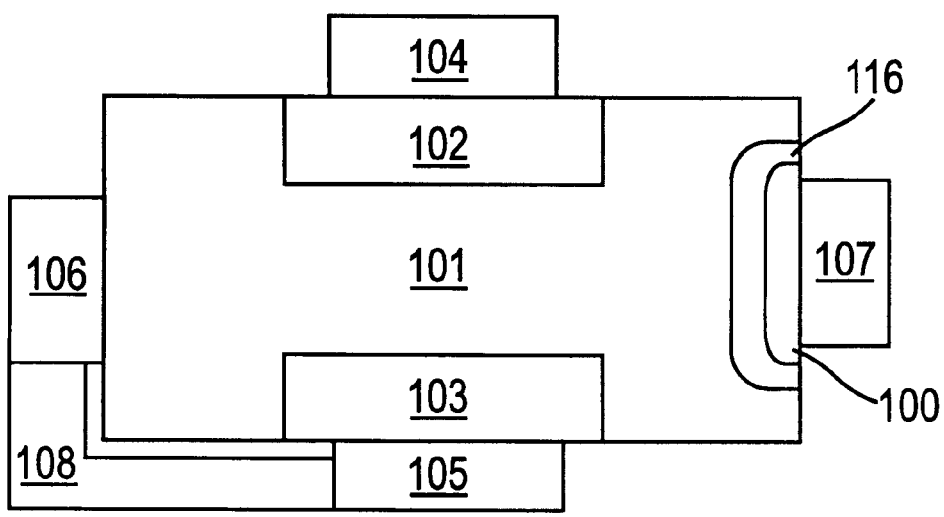
FIG. 1 is a schematic showing of the base structure

FIG. 1 is a schematic, sectional representation of the structure of the invention, which comprises a semiconductor region 101 of a first conductivity type as a base material, which is bordered at two locations by non-touching regions 102 and 103, which are referred to as active and passive control zones, and respectively form a blockable transition with the semiconductor region 101, and are electrically contacted by the electrodes 104 and 105. Furthermore, the two edges of region 101 that are not bordered by the two control zones 102 and 103 are electrically contacted, at least in a region, by the electrodes 106 and 107. In the third dimension, the structure of the invention has no electrically-conductive path between the electrodes 106 and 107 that cannot be influenced by the zones 102 and 103.

The structure of the invention is characterized in that the contacts 105 and 106 are electrically connected by a layer 108, while the contacts 104 and 105 can have different potentials, unlike in conventional structures, and the semiconductor material 101 has a band gap larger than 1.2 eV (at room temperature).

Examples of materials considered as the semiconductor material are gallium arsenide, the different polytypes of silicon carbide, gallium nitride, diamond and aluminum nitride.

Independently of one another, the regions 102 and 103 can comprise different semiconductor materials of the same semiconductor material as the region 101, or comprise a metal. If the zone 102 or 103 comprises a semiconductor material, it must possess the opposite conductivity type of the region 101. If the zones comprise metal, the metal must form a Schottky transition with the base material of the region 101.

The expansion of the space-charge zone around the zone 102, and thus the cross section of the conductive channel in the base material between the electrodes 106 and 107, can be controlled by the application of a voltage between the electrodes 104 and 106. If the voltage between the electrodes 104 and 106 becomes so large that the space-charge zones of the opposite regions 102 and 103 touch, the conductive channel between 106 and 107 is interrupted and the connection between them becomes highly-resistive. Generally, in this operating state, a current flow that increases strongly superproportionally with a further increasing voltage between the electrodes 104 and 106 occurs between the electrodes 104 and 105, and thus via the conductive connection 108 to the electrode 106, and possibly leads to the destruction of the component or the overload of the control generator.

The invention, in contrast, is based on the realization that the difference between the control voltage during pinch-off of the conductive channel and the control voltage when this current is set can be influenced by the band gap of the semiconductor material in the region 101.

The precise value of this control-voltage difference is essentially determined by the energy gap of the semiconductor material with a given structure and doping. It is, however, also dependent on other semiconductor properties, especially the relative permittivity. Therefore, no clear connection can be established between the control-voltage difference and the band gap. As has been discovered through simulations, however, a semiconductor material having a larger band gap also tends to lead to a larger difference between the control voltage when the conductive channel is pinched off and the control voltage when the current is set via the control connector. The connection 108 can therefore only be used in association with a correspondingly-selected semiconductor material (wide band-gap material), and would lead to a high control-power requirement, or even critical operating states, in silicon, for example.

In the structures known up to now, this large control-power requirement could only be avoided with a short-circuit between the electrodes 104 and 105, which rules out the connection 108, and the parasitic capacitances become very large. In the structure of the invention, in contrast, the parasitic capacitances between the electrodes 104 and 106 (minimum input capacitance) or between 104 and 107 (reverse-transfer capacitance) can be minimized essentially by a small expansion of the region 102 of the active control zone. The capacitance between the electrodes 105 and 106 is practically short-circuited by the connection 108, and is thus virtually ineffective. The capacitance between the electrode 105 of the passive control zone 103 and the drain electrode 107 is insignificant for most applications, because it is recharged by the connected load circuit, and not by the control circuit, as in conventional structures.

In addition to the above-described structure, in which a conductive channel is disposed between the electrodes 106 (source) and 107 (drain) without the application of a control voltage, that is, current can flow ("normally-on"), a "normally-off" structure can also be produced in a suitable design. For this purpose, the spacing of the active control zone 102 from the passive control zone 103 must be so small, or the doping of the base region 101 must be selected to be so low, that the static space-charge zones around the control zones 102 and 103 (i.e., without the application of a control voltage between the electrodes 104 and 106) already touch.

Overall, the structure of the invention constitutes an intermediate solution between JFET and MESFET, in which no control electrode can be short-circuited with the load-circuit electrodes, and the so-called current limiter, in which all control electrodes are short-circuited with a load-circuit electrode.

A variation of the structure of the invention that deviates further from the so-called FCTh (Field-Controlled Thyristor) or SITh (Static Induction Thyristor) includes a semiconductor zone 100, which extends in front of the drain electrode 107 and has the opposite conductivity type of the base region 101. With a current flow between the electrodes of the source and drain (107 and 106) through this zone, minority carriers are injected into the base region 101, thereby increasing the conductivity there. Because at least the threshold voltage of the transition between the region 101 and the additional zone 100 must be overcome, this structure is particularly well-suited for high-blocking components. Moreover, a further zone 116 can be disposed between this additional zone and the region 101, the additional zone having the same conductivity type as the region 101, but a heavier doping. This zone improves the blocking capability of the component.

The following advantages ensue from the invention:
1) The structure can be used to produce vertical components (see the third embodiment).
2) No special wafers or technological steps are required as the starting material for producing this structure (see embodiments).
3) No high thermal resistances are present due to additional insulator layers. Therefore, only a comparatively low internal heating occurs.
4) It is completely compatible with the RESURF technique, and therefore also suitable for high-blocking components.
5) The parasitic capacitances can be made very small, or made to be only of secondary importance for operation, or even be completely omitted, by the layout or technical measures. This attains higher limit frequencies and lower switching losses.

EXAMPLE 1

Figure 2:
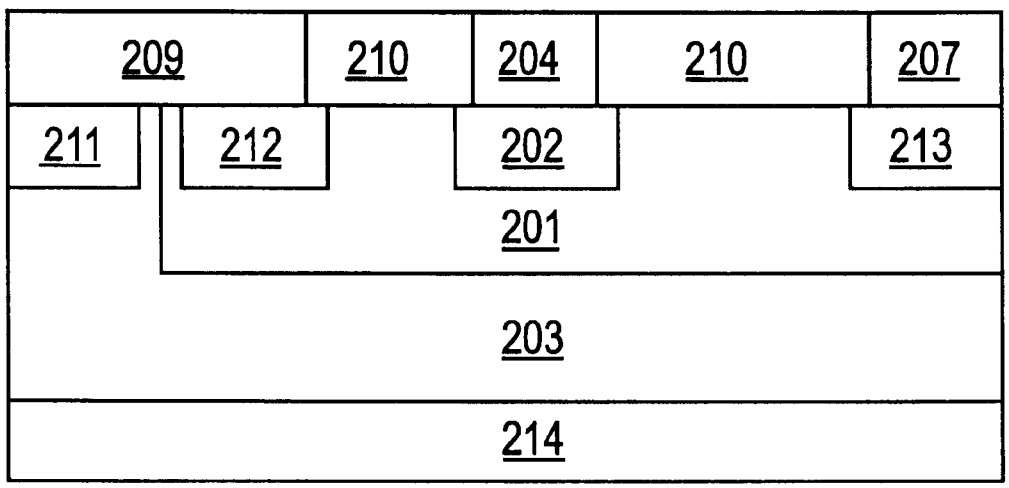
FIG. 2 is a schematic showing of a first embodiment (implantation) according to the invention

FIG. 2 shows the structure of a lateral component that was produced through ion implantation. The starting material is heavily-doped, n- or p-conducting SiC (214). A 10 $\mu$m-thick, p-conducting SiC epitaxy layer is applied to the starting material as a passive control zone 203 with a doping concentration of $10^{16}$ cm$^{-3}$. An n-conducting channel zone or base region 201 having a doping concentration of $10^{17}$ cm$^{-3}$ is produced in this layer through nitrogen or phosphorous ion implantation. In this region 201, the heavily-doped, n-conducting source zone and the drain zone 212 and 213, respectively, are produced through nitrogen or phosphorous ion implantation for improving the electrical contacting of the base region 201. Finally, the heavily-doped, p-conducting zones, the active control zone 202 and the contacting zone 211, are produced through aluminum or boron ion implantation. The difference in the penetration depth of the ion implantations of 201 and 202 is about 0.4 $\mu$m. Then, the implantations are annealed or activated through a temperature treatment preferably between 1000 and 2000° C. A silicon-dioxide layer 210 is applied for passivating the upper surface at which the active control zone 202 and the source and drain zones or regions 212 and 213 are disposed. The active control zone 202 and the contacting zone 211, as well as the source and drain 212 and 213, are made accessible through masked etching of this oxide layer, then metallized, with the zones 211 and 212 preferably being short-circuited by a metallization 209.

If a potential that is positive with respect to the electrode 209 is applied to the drain electrode 207 in the component produced in this manner, a current flows, without a potential difference between the electrodes 204 and 209, from 207 after the electrode 209 ("normally-on"). Through the application of a potential that is negative with respect to the electrode 209 to the electrode 204 of the active control zone 202, the space-charge zone in the region around 202 can be enlarged, and the current flow between the electrodes 207 and 209 can therefore be reduced. Through the application of a potential that is positive with respect to the electrode 209 to the electrode 204, the space-charge zone around the region of the active control zone 202 is reduced, and the current between the electrodes 207 and 209 increases. If the blocking layer between the active control zone 202 and the base 201 is a pn transition, when the threshold voltage is exceeded, the conductivity in the channel region of the base 201 can be further improved (conductivity modulation) through the injection of minority carriers.

EXAMPLE 2

Figure 3:
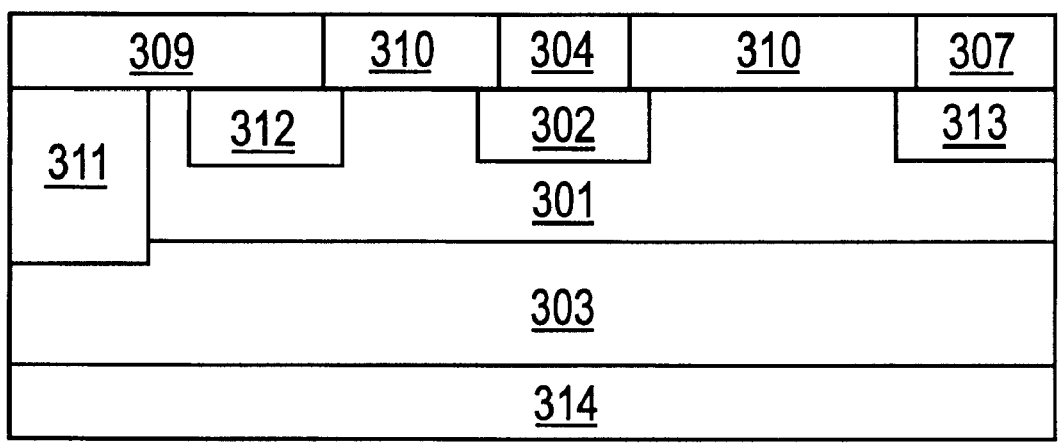
FIG. 3 is a schematic showing of a second embodiment (epitaxy) according to the invention

FIG. 3 shows the structure of a lateral component that was produced in a second epitaxy step. The starting material is heavily-doped, n- or p-conducting SiC (region 314). A 10 μm-thick, p-conducting epitaxy layer 303 is applied to the starting material as a passive control zone, with a doping concentration of $10^{16}$ cm$^{-3}$, and a 1 μm-thick, n-conducting epitaxy layer 301 is applied as the base region for the channel zone, with a doping concentration of $10^{17}$ cm$^{-3}$. To contact the layer 303, the heavily-doped, p-conducting zone 311 is produced through aluminum or boron ion implantation, the layer extending from the surface through the base region 301. In the base region 301, the heavily-doped, n-conducting source and drain zones 312 and 313 are produced through nitrogen or phosphorous ion implantation for improving the electrical contact of the source and drain to the base region 301 and its channel zone. Finally, the 0.6 μm-thick, heavily-doped, p-conducting active control zone 302 is produced through aluminum or boron ion implantation. Then, the implantations are annealed or activated through a temperature treatment preferably between 1000 and 2000° C. A silicon-dioxide layer 310 is applied for passivating the surface. The control zone 302 and the contacting zones 311, 312 and 313 are made accessible through masked etching of this oxide layer, then metallized, with the zones 311 and 312 being short-circuited by the electrode 309. The function of this component is analogous to that of the first embodiment.

Figure 5:
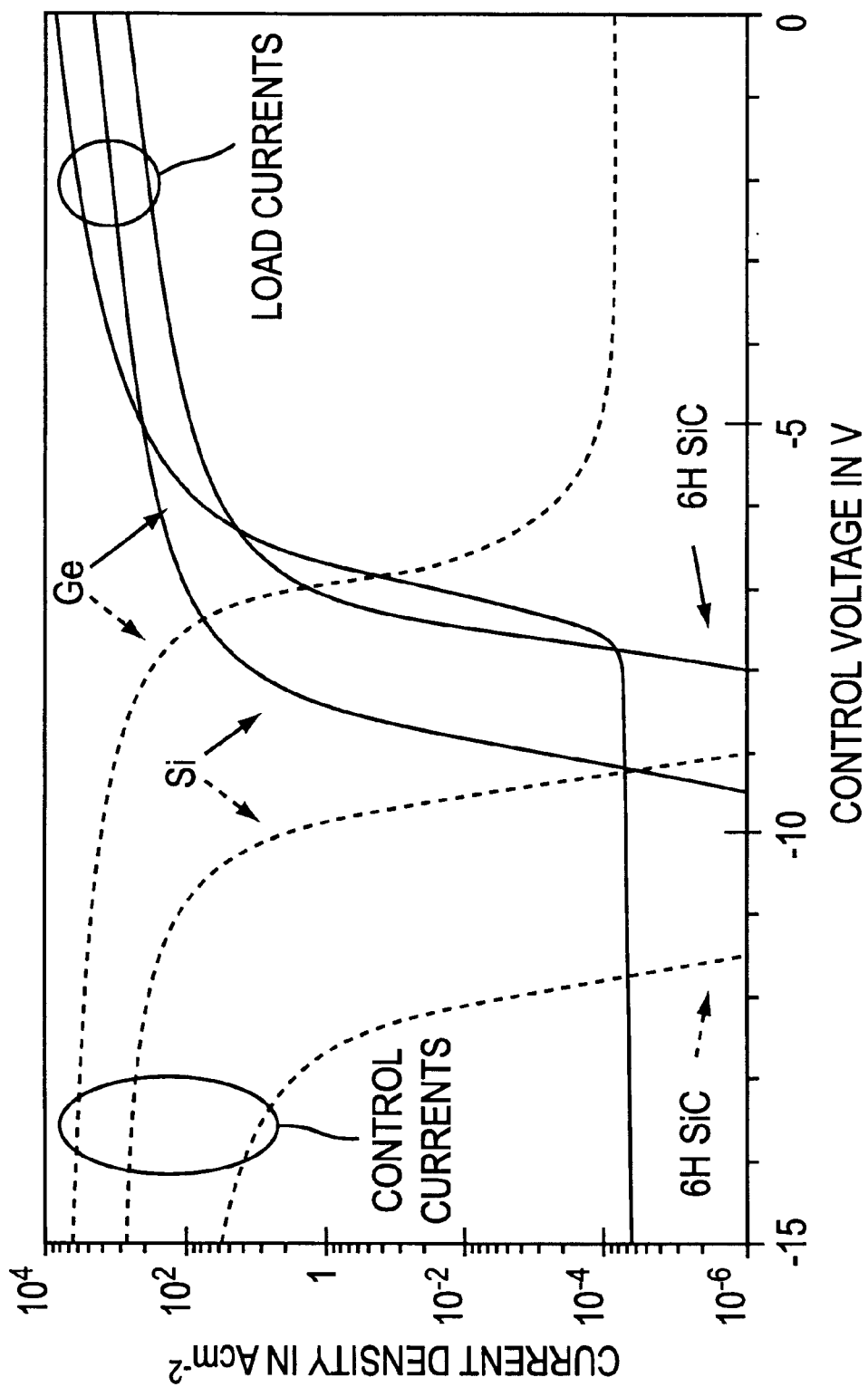
FIG. 5 is a graph showing the result of a simulation.

FIG. 5 shows the current densities that have been determined with the use of simulations, and occur at a component having the structure, doping, etc., described in this embodiment, but different semiconductor materials (germanium, silicon, 6H silicon carbide). The current densities are a function of the control voltage, that is, the voltage between the electrodes 304 and 309. The load current, in this example the current that flows from 313 to 312 with a fixed output voltage of 10 V (between the electrodes 307 and 309), is shown as a solid line. In contrast, the control current, namely the current that flows undesirably through the control zone 302 to 303, is shown as a dashed line.

The problems associated with a semiconductor material having a small band gap can be seen clearly in the example of the germanium component (band gap of germanium at room temperature: $E_G(300K)=0.66$ eV). If, for example, a current density of $10^2$ Acm$^{-2}$ is defined as harmless for the control generator and sufficiently-low for the "off" state of the load circuit, the germanium component cannot be used. With a current density of about 0.1 Acm$^{-2}$, the control current is exactly as large as the load current, and increases approximately exponentially with the control voltage. The silicon component (silicon: $E_G(300K)=1.12$ eV), in contrast, has a voltage difference of merely one Volt, which is, however, by no means sufficient for reliable operation. Only with the use of silicon carbide (in this case, the 6H polytype with $E_G(300K)=3$ eV) is the voltage difference increased to over 4.5 V, which can assure reliable operation.

EXAMPLE 3

Figure 4:
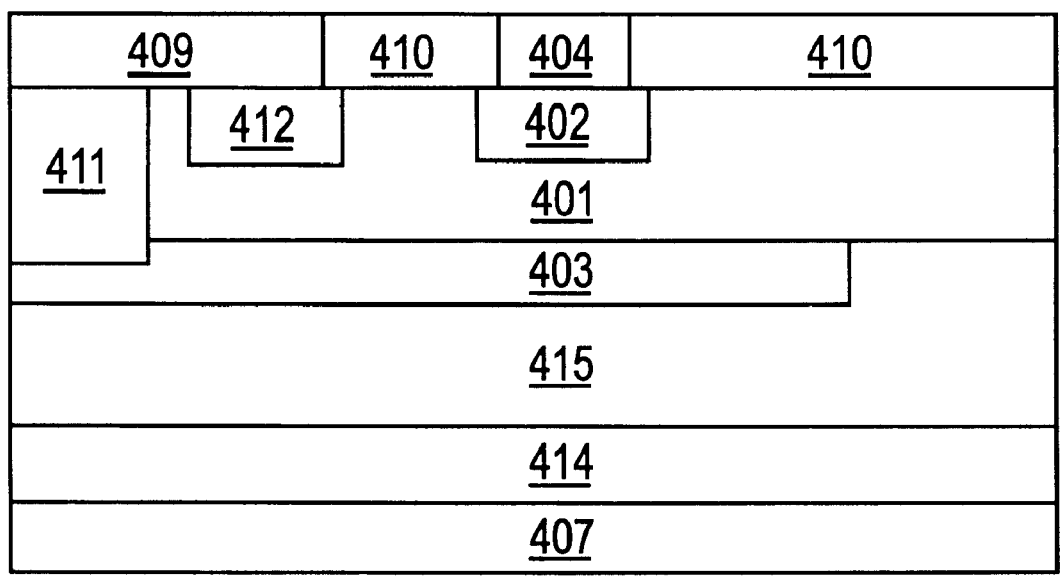
FIG. 4 is a schematic showing of a vertical component, as a third embodiment according to the invention

FIG. 4 shows the structure of a vertical component of the invention that was produced in a second epitaxy step. The starting material is a heavily-doped, n-conducting SiC layer 414. A 10 μm-thick, n-conducting epitaxy layer 415 having a doping concentration of $10^{16}$ cm$^{-3}$ is applied to this substrate layer 415 414. In this epitaxy layer, the 0.6 μm-thick, heavily-doped, p-conducting passive control or shielding zone 403 is produced through aluminum or boron ion implantation, then annealed or activated through a temperature treatment preferably between 1000 and 2000° C. A second, 1 μm-thick, n-conducting epitaxy layer 401 having a doping concentration of $10^{17}$ cm$^{-3}$ is applied as the base region. The heavily-doped, p-conducting contacting zone 411, which extends from the surface through the base region 401, is produced through aluminum or boron ion implantation for contacting the zone 403. In a further embodiment for producing a contacting zone, a window region is etched off, so the zone 403 is directly accessible from the surface. In the region 401, the heavily-doped, n-conducting zone 412 is produced through nitrogen or phosphorous ion implantation for improving the electrical contact to the base region 401. Finally, the 0.6 μm-thick, heavily-doped, p-conducting active control zone 402 is produced through aluminum or boron ion implantation. Then, the implantations are annealed or activated through a temperature treatment preferably between 1000 and 2000° C. A silicon-dioxide layer 410 is applied for passivating the surface. The active control zone 402 and the contacting zones 411 and 412 are made accessible through masked etching of this oxide layer, then metallized, with the zones 411 and 412 preferably being short-circuited by 409. Moreover, the electrode 407 is produced through the metallization of the rear side.

The notable feature of this structure is the decoupling of the control region and the drift region, with the separation being optimized. The function of the control region (channel zone 401, active control zone 402 and passive control or shielding zone 403) is analogous to the structure of the first embodiment. In addition, however, the drift zone 415 is present, which must absorb the blocking voltage between the shielding zone 403 and the substrate 414 during operation. With small blocking voltages, the upper control region of the drift zone is shielded by the narrow connecting region (in the aforementioned values, for example, 2 pm) between two shielding zones 403, so no potential punch-through occurs. This structure is therefore especially well-suited for high blocking voltages.

What is claimed is:

1. A controllable semiconductor structure having a base region, a source region and a drain region, with a conductive channel being provided in the base region between the source and the drain, and wherein the channel can be pinched off by zones parallel thereto, including an active control zone and an oppositely-located, passive control zone, which respectively form a blockable transition to the base region; a conductive connection exists between the passive control zone and the source region; and the semiconductor material of the base region has a band gap of more than 1.2 eV.

2. The semiconductor structure according to claim 1, characterized in that the source region (106, 212, 312, 412)

and the drain region (107, 213, 313, 413) are disposed on oppositely-located surfaces.

3. The semiconductor structure according to one of claims 1 through 3, wherein the active control zone and the passive control zone are at potentials that are selected independently of one another.

4. The semiconductor structure according to one of claims 1 through 3, wherein the expansion of the space-charge zone in the base can be controlled by the application of a voltage between the source and the electrode of the active control zone.

5. The semiconductor structure according to claim 1 or 2, wherein another semiconductor zone extends in front of the drain region, with the another zone having the opposite conductivity type of the base region.

6. The semiconductor structure according to claim 5, wherein a further zone is disposed between the base region and the another zone, the further zone having the same conductivity type as the base region, but a heavier doping.

7. The semiconductor structure according to one of claims 1 through 3, wherein the control-voltage difference that exists between the pinch-off of the conductive channel and the setting of the control current increases with increase band gap of the semiconductor material of the base region.

8. The semiconductor structure according to claim 1, wherein the source and drain regions and the active control zone are disposed on the same surface of the semiconductor component.

9. The semiconductor structure according to claim 1, wherein one of gallium arsenide, the different polytypes of silicon carbide, gallium nitride, diamond and aluminum nitride are provided as the semiconductor material.

10. The semiconductor structure according to claim 9, wherein the active and passive control zones, independently of one another, comprise the same semiconductor material as the base region, a semiconductor material that differs from the base region material, or a metal.

* * * * *